United States Patent
Kim et al.

(10) Patent No.: US 10,707,548 B2
(45) Date of Patent: Jul. 7, 2020

(54) IMPEDANCE MATCHING DEVICE FOR REDUCING REFLECTION LOSS BY SPLITTING DIGITAL SIGNAL AND TEST SYSTEM HAVING THE SAME

(71) Applicant: Samsung Electronics Co., Ltd., Suwon-si, Gyeonggi-do (KR)

(72) Inventors: Jae Hyun Kim, Yongin-si (KR); Sooyong Park, Asan-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 317 days.

(21) Appl. No.: 15/336,042

(22) Filed: Oct. 27, 2016

(65) Prior Publication Data
US 2017/0133736 A1 May 11, 2017

(30) Foreign Application Priority Data
Nov. 11, 2015 (KR) .................. 10-2015-0158172

(51) Int. Cl.
| | |
|---|---|
| *G01R 31/00* | (2006.01) |
| *H01P 3/08* | (2006.01) |
| *G01R 31/28* | (2006.01) |
| *G01R 31/319* | (2006.01) |
| *G01R 31/26* | (2020.01) |
| *H01P 5/12* | (2006.01) |

(52) U.S. Cl.
CPC ............ *H01P 3/08* (2013.01); *G01R 31/2607* (2013.01); *G01R 31/2834* (2013.01); *G01R 31/2856* (2013.01); *G01R 31/2874* (2013.01); *G01R 31/2875* (2013.01); *G01R 31/2877* (2013.01); *G01R 31/2879* (2013.01); *G01R 31/31924* (2013.01); *H01P 5/12* (2013.01); *G01R 31/00* (2013.01); *G01R 31/002* (2013.01)

(58) Field of Classification Search
CPC ............ G01R 31/2856; G01R 31/2875; G01R 31/2877; G01R 31/2874; G01R 31/31924; G01R 1/0491; G01R 31/265; G01R 31/318511
USPC ......... 324/71, 378, 403, 415, 425, 500, 537, 324/750.01, 750.03, 750.05, 762.01, 324/762.05
See application file for complete search history.

(56) References Cited

U.S. PATENT DOCUMENTS

| | | | |
|---|---|---|---|
| 5,119,048 | A | 6/1992 | Grunwell |
| 6,639,487 | B1 | 10/2003 | Salmela et al. |

(Continued)

FOREIGN PATENT DOCUMENTS

JP         2000269710    *  9/2000    ............... H01P 5/02

OTHER PUBLICATIONS

JP 2000269710 machine translation, Sep. 29, 2000.*

*Primary Examiner* — Raul J Rios Russo
(74) *Attorney, Agent, or Firm* — Harness, Dickey & Pierce, P.L.C.

(57) ABSTRACT

An impedance matching device includes a tapered strip line and a plurality of strip lines. The tapered strip line extends in a first direction on a substrate and has a width in a second direction perpendicular to the first direction. The tapered strip line includes first to n-th segments having identical lengths and different widths, wherein the 'n' is a natural number of two or more. The plurality of strip lines are connected to the n-th segment such that an input signal received through the first segment is split.

11 Claims, 10 Drawing Sheets

(56) References Cited

U.S. PATENT DOCUMENTS

| | | |
|---|---|---|
| 6,646,518 B2 | 11/2003 | Tajima |
| 6,963,312 B2 | 11/2005 | Schuneman et al. |
| 6,970,688 B2 | 11/2005 | Nibe |
| 8,085,208 B2 | 12/2011 | Wallace |
| 8,259,027 B2 | 9/2012 | Isom et al. |
| 8,379,405 B2 | 2/2013 | Grossbach et al. |
| 8,816,793 B2 | 8/2014 | Masuda |
| 8,933,763 B2 | 1/2015 | Fast |
| 8,952,857 B2 | 2/2015 | Diaz |
| 2006/0160504 A1* | 7/2006 | Ichitsubo ............ H01L 23/66 455/127.1 |
| 2006/0258187 A1* | 11/2006 | Behziz ............ H05K 1/0251 439/77 |
| 2007/0046393 A1* | 3/2007 | Quan ............ H01P 5/16 333/128 |
| 2007/0063791 A1* | 3/2007 | Wu ............ H01P 5/02 333/125 |
| 2008/0018350 A1* | 1/2008 | Chao ............ G01R 1/07378 324/754.18 |
| 2011/0187399 A1* | 8/2011 | Laquai ............ H01P 5/02 324/756.01 |
| 2011/0204993 A1* | 8/2011 | Masuda ............ H01P 5/028 333/128 |
| 2012/0062335 A1* | 3/2012 | Sherrer ............ H01P 5/12 333/127 |
| 2012/0193771 A1* | 8/2012 | Masuda ............ H01P 5/12 257/664 |
| 2012/0313832 A1 | 12/2012 | Pazin et al. |
| 2014/0218131 A1* | 8/2014 | Sherrer ............ H01P 5/12 333/136 |
| 2018/0069287 A1* | 3/2018 | Sherrer ............ H01P 5/12 |

* cited by examiner

IMPEDANCE MATCHING DEVICE FOR REDUCING REFLECTION LOSS BY SPLITTING DIGITAL SIGNAL AND TEST SYSTEM HAVING THE SAME

CROSS-REFERENCE TO RELATED APPLICATIONS

This U.S. non-provisional patent application claims priority under 35 U.S.C. § 119 to Korean Patent Application No. 10-2015-0158172, filed Nov. 11, 2015, in the Korean Intellectual Property Office, the entire contents of which are hereby incorporated by reference.

BACKGROUND

1. Field

Some example embodiments of the inventive concepts described herein relate to an impedance matching device, and more particularly, relate to an impedance matching device configured to reduce a reflecting loss that occurs when a digital signal received is split to test a semiconductor device.

2. Description of the Related Art

Generally, when testing a semiconductor device, one piece of automatic test equipment (ATE) connects to a plurality of semiconductor devices, and performs a test operation to increase test efficiency and to reduce a test time. In this case, after receipt through one (or more) transmission lines, a test signal transmitted from the ATE is split and transmitted to each semiconductor device.

However, in this case, an impedance mismatch may occur at a point at which the test signal is split. This causes an increase in a reflection coefficient and the distortion of the test signal due to a reflection loss. To resolve this issue, an active element (i.e., a fan-out-buffer) may be used. However, the use of the active element causes an increase in power consumption and/or a temperature.

SUMMARY

Some example embodiments of the inventive concepts provide an impedance matching device not using an active element and capable of reducing or minimizing a reflection loss according to the split of a signal during the test operation of the semiconductor device.

According to an example embodiment of the inventive concepts, an impedance matching device includes a tapered strip line and a plurality of strip lines. The tapered strip line extends in a first direction on a substrate and has a width in a second direction perpendicular to the first direction. The tapered strip line includes first to n-th segments having identical lengths and different widths, wherein the 'n' is a natural number of two or more. The plurality of strip lines is connected to the n-th segment such that an input signal received through the first segment is split.

A combined impedance of the strip lines and an impedance of the n-th segment may be identical to each other. The input signal may be a digital signal transmitted according to a base band transmission method. The width of the first to n-th segments may increase in accordance with an increase in the 'n'.

Lengths of the strip lines may be identical to one another. A length of the tapered strip line may be half of a wavelength of the input signal. The impedance matching device may further include a dielectric layer between the substrate and the tapered strip line, and between the substrate and the strip lines.

According to another example embodiment of the inventive concepts, an impedance matching device includes a tapered strip line and a plurality of strip lines. The tapered strip line extends in a first direction on a substrate and having a width in a second direction perpendicular to the first direction. The tapered strip line includes a first end having a first width and a second end having a second width greater than the first width, the first end is configured to receive an input signal, and the second end is on an opposite side of the first end. The plurality of strip lines is connected to the second end such that the input signal is split.

The tapered strip line may include first to n-th segments having identical lengths and different widths. The 'n' may be a natural number of two or more. The width of the first to n-th segments increases in accordance with an increase in the 'n'.

A combined impedance of the strip lines and an impedance of the n-th segment may be identical to each other.

Lengths of the strip lines may be identical to one another. The input signal may be a digital signal transmitted according to a base band transmission method.

The width of the tapered strip line may continuously increase from the first end toward the second end. The tapered strip line may have a trapezoidal shape.

According to still another example embodiment of the inventive concepts, a test system includes automatic test equipment (ATE) configured to perform a test operation respect to a plurality of devices under test, and an impedance matching device configured to receive an input signal for performing the test operation, to split the input signal, and to transmit the split input signal to the plurality of devices under test. The impedance matching device includes a tapered strip line and a plurality of strip lines. The tapered strip line extends in a first direction on a substrate and having a width in a second direction perpendicular to the first direction. The tapered strip line includes first to n-th segments having identical lengths and different widths, wherein the 'n' is a natural number of two or more. The plurality of strip lines are connected to the n-th segment such that the input signal is split.

A combined impedance of the strip lines and an impedance of the n-th segment may be identical to each other. The input signal may be a digital signal transmitted according to a base band transmission method. The width of the first to n-th segments may increase in accordance with an increase in the 'n'. Lengths of the strip lines may be identical to one another. A length of the tapered strip line may be half of a wavelength of the input signal.

According to yet another example embodiment of the inventive concepts, an impedance matching device includes a strip line extending in a first direction on a substrate, the strip line including a first section including a first end portion and a second end portion opposite the first end portion in the first direction, the second end portion having a greater width than the first end portion in a second direction perpendicular to the first direction, the first end portion configured to receive an input signal, and at least two second sections connected to the second end portion such that the input signal is split.

The first section may include a plurality of segments having identical lengths and different widths, and the width of the plurality of segments may increase in the second direction extending from the first end portion to the second end portion.

Lengths of the second sections may be identical to one another. The width of the first section may continuously increase from the first end portion toward the second end portion. A length of the first section may be half of a wavelength of the input signal. The impedance matching device may include a dielectric layer between the substrate and the strip line. The impedance matching device may not include an active element.

BRIEF DESCRIPTION OF THE FIGURES

The above and other objects and features will become apparent from the following description with reference to the following figures, wherein like reference numerals refer to like parts throughout the various figures unless otherwise specified, and wherein.

DETAILED DESCRIPTION

It is to be understood that both the foregoing general description and the following detailed description are provided as examples, for illustration and not for limiting the scope of the inventive concepts. Reference will now be made in detail to the present example embodiments of the inventive concepts, examples of which are illustrated in the accompanying drawings. Wherever possible, the same reference numbers are used in the drawings and the description to refer to the same or like parts.

It will be understood that when an element is referred to as being "connected," or "coupled," to another element, it can be directly connected or coupled to the other element or intervening elements may be present. In contrast, when an element is referred to as being "directly connected," or "directly coupled," to another element, there are no intervening elements present. As used herein, the term "and/or," includes any and all combinations of one or more of the associated listed items.

Even though the terms first, second, etc. may be used herein to describe various elements, components, regions, layers and/or sections, it should be understood that these elements, components, regions, layers and/or sections should not be limited by these terms. These terms are used only to distinguish one element, component, region, layer, or section from another region, layer, or section. Thus, a first element, component, region, layer, or section discussed below could be termed a second element, component, region, layer, or section without departing from the teachings of the present inventive concepts.

Spatially relative terms, such as "beneath", "below", "lower", "above", "upper", and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features.

The terminology used herein is for the purpose of describing particular embodiments only and is not intended to be limiting of example embodiments of the inventive concepts. As used herein, the singular forms "a," "an," and "the," are intended to include the plural forms as well, unless the context clearly indicates otherwise. As used herein, the terms "and/or" and "at least one of" include any and all combinations of one or more of the associated listed items. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof.

Below, example embodiments of the inventive concepts will be described with reference to accompanying drawings in order to describe the example embodiments of the inventive concepts in detail to the extent that one skilled in the art can more easily implement the scope and spirit of the inventive concepts.

Figure 1:
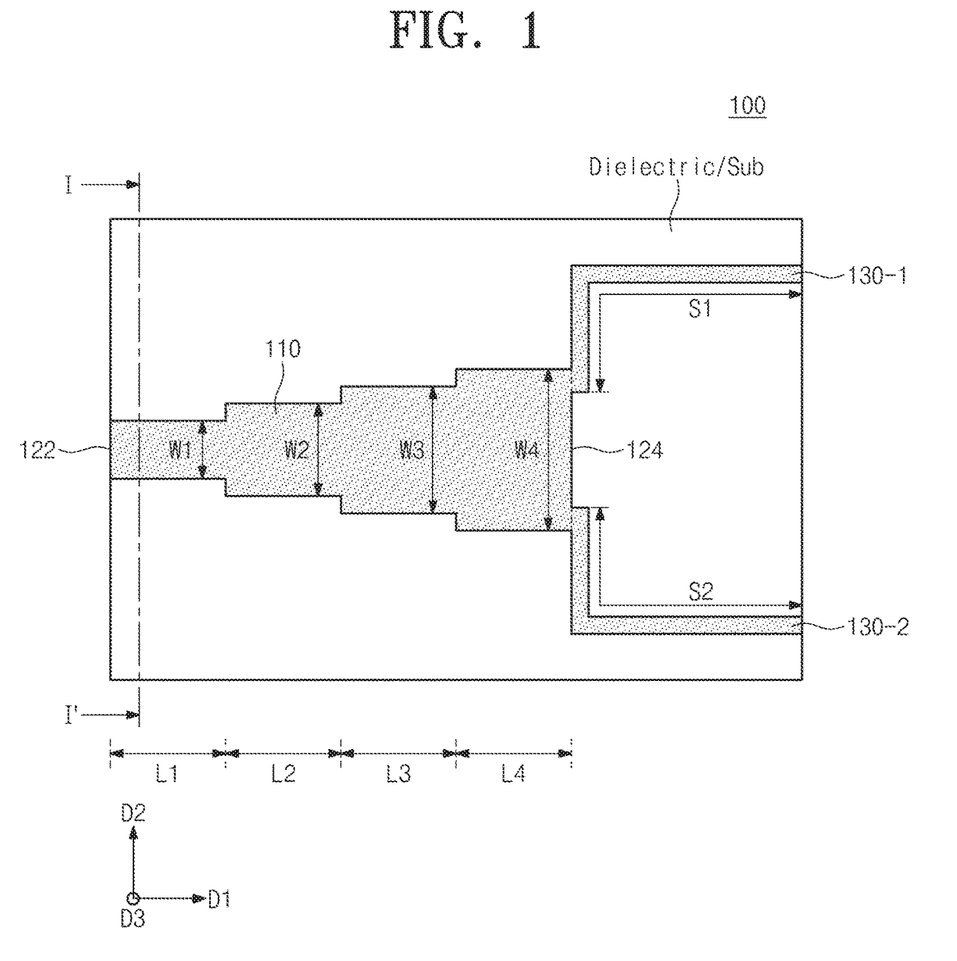
FIG. 1 is a plan view illustrating an impedance matching device according to an example embodiment of the inventive concepts.

FIG. 1 is a plan view illustrating an impedance matching device 100 according to an example embodiment of the inventive concepts. Referring to FIG. 1, an impedance matching device 100 may include a tapered strip line 110 and a plurality of strip lines 130-1 and 130-2. In FIG. 1, the impedance matching device 100 is illustrated as being arranged on a substrate and a dielectric layer.

The tapered strip line 110 may be arranged to extend in a first direction D1 and may have a width in a second direction D2 perpendicular to the first direction D1. The tapered strip line 110 may have a first end 122, through which a signal (e.g., digital signal) is input from an external device, and a second end 124 which is a point where the second end 124 is in contact with the strip lines 130-1 and 130-2. Moreover, the signal input through the first end 122 may be split at the second end 124 and may be output to an end of each of the strip lines 130-1 and 130-2.

The tapered strip line 110 may be composed of a plurality of segments of which widths discretely increase. For example, the tapered strip line 110 may include a first segment having a length of L1 and a width of W1, a second segment having a length of L2 and a width of W2, a third segment having a length of L3 and a width of W3, and a fourth segment having a length of L4 and a width of W4. For example, L1 to L4 may be identical to one another. Moreover, W2 may be greater than W1, W3 may be greater than W2, and W4 may be greater than W3. An example embodiment of the inventive concepts is illustrated as the tapered strip line 110 includes four segments. However, the scope and spirit of the inventive concepts may not be limited thereto. That is, the number of segments may not be limited thereto.

The strip lines 130-1 and 130-2 may be connected to the second end 124 of the tapered strip line 110. As illustrated in FIG. 1, each of the strip lines 130-1 and 130-2 may be connected to a portion of the second end 124 of the tapered strip line 110. Moreover, a length S1 of the first strip line 130-1 and a length S2 of the second strip line 130-2 may be identical to each other. Even though the first and second strip lines 130-1 and 130-2 are illustrated as being symmetrical with each other in FIG. 1, it may not matter that the first and second strip lines 130-1 and 130-2 are not symmetrical when the lengths of the first and second strip lines 130-1 and 130-2 are only identical with each other.

According to an example embodiment of the inventive concepts, the width W4 of the second end 124 of the tapered strip line 110 may be determined according to the magnitude of combined impedance of the first strip lines 130-1 and the second strip lines 130-2. For example, impedance may not be matched at a point (i.e., a point where the first tapered strip line 110 is in contact with the strip lines 130-1 and 130-2) at which a split occurs in the impedance matching device 100. That is, an impedance mismatch may occur.

To help understand the inventive concepts, it is assumed that the characteristic impedance of the fourth segment having a length of IA and a width of W4 is 50Ω and the characteristic impedance of each of the strip lines 130-1 and 130-2 is 60Ω. In this case, because the combined impedance of the strip lines 130-1 and 130-2 is 30Ω, impedance may not be matched at a point at which a split occurs in the impedance matching device 100. In this case, a digital signal input to the first end 122 of the tapered strip line 110 may not be transmitted to the strip lines 130-1 and 130-2 and may be reflected. Accordingly, the width W4 of the fourth segment may be adjusted such that impedance is matched at a split point. As a result, a reflection loss according to the split of the impedance matching device 100 may be reduced or minimized.

Figure 2:
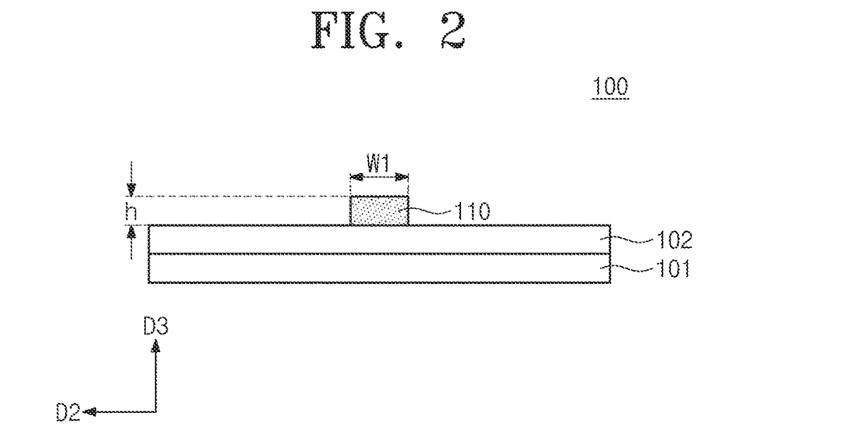
FIG. 2 is a cross-sectional view taken along line of FIG. 1.

FIG. 2 is a cross-sectional view taken along I-I' line of FIG. 1.

A dielectric layer 102 may be provided on a substrate 101. For example, the substrate 101 may be composed of various types of substrates such as a printed circuit board (PCB), a flexible board, and a tape board. The impedance matching device 100 may be provided on the dielectric layer 102. However, because FIG. 2 is a cross-sectional view, FIG. 2 only illustrates the tapered strip line 110.

The tapered strip line 110 may include various conductive materials such as a metal. Likewise, although not illustrated, the strip lines 130-1 and 130-2 (refer to FIG. 1) may include various conductive materials. The tapered strip line 110 may have a thickness of 'h' in a third direction D3 perpendicular to the second direction D2.

Figure 3:
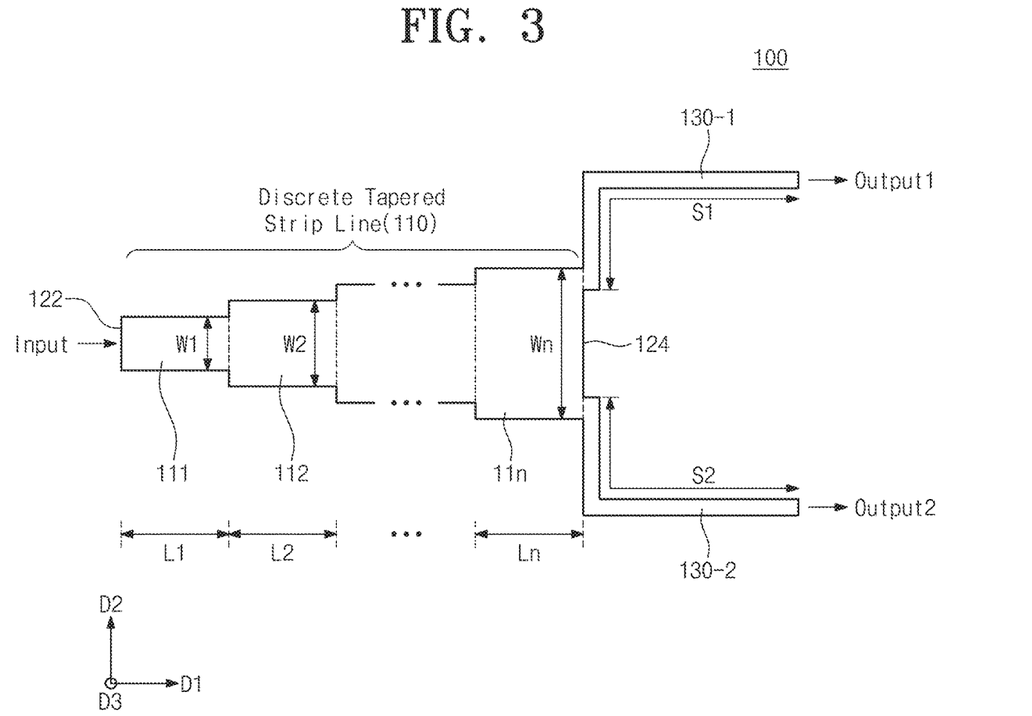
FIG. 3 is a schematic diagram illustrating a device generalizing an impedance matching device illustrated in FIG. 1.

FIG. 3 is a schematic diagram illustrating a device generalizing an impedance matching device 100 illustrated in FIG. 1. To simplify drawings, a substrate and a dielectric layer illustrated in FIG. 1 may be omitted. The impedance matching device 100 may include the discrete tapered strip line 110, the first strip line 130-1 and the second strip line 130-2. Here, term "discrete" may mean that the width of the tapered strip line 110 increases not continuously but stepwise.

The tapered strip line 110 may be arranged to extend in the first direction D1 and may have a width in the second direction D2 perpendicular to the first direction D1. The tapered strip line 110 may be composed of a plurality of segments 111 to 11$n$. The segments 111 to 11$n$ may be serially arranged in the first direction D1. The first segment 111 may have a length of L1 and a width of W1. Similarly, the n-th segment 11$n$ may have a length of Ln and a width of Wn. Here, 'n' may be an integer, and as 'n' increases, values of Ln and Wn may increase.

The first end 122 of the tapered strip line 110 may receive an input signal Input from an external device (e.g., semiconductor test equipment). Here, the input signal Input received from an external device may be a digital signal transmitted according to a base band transmission method. Moreover, the input signal Input may be test data for determining whether a semiconductor device connected to the impedance matching device 100 fails or not. The first and second strip lines 130-1 and 130-2 may be connected to the second end 124 of the tapered strip line 110. That is, the impedance matching device 100 may be split at the second end 124.

The input signal Input received from an external device may be split near the second end 124 and may be output Output1 and Output2) through ends of the first and second strip lines 130-1 and 130-2. The signals Output1 and Output2 respectively output from the first and second strip lines 130-1 and 130-2 may be transmitted to a test target (e.g., semiconductor device).

According to an example embodiment of the inventive concepts, to implement the impedance matching device 100 matching characteristic impedance, there are two conditions. The first condition may be that impedance should be matched at a point where the tapered strip line 110 is in contact with the first and second strip lines 130-1 and 130-2. The second condition may refer to a condition about the sum i.e., L1+L2+ . . . +Ln) of a length of total segments arranged in the first direction D1. Above all, the first condition will be described with reference to FIG. 4.

Figure 4:
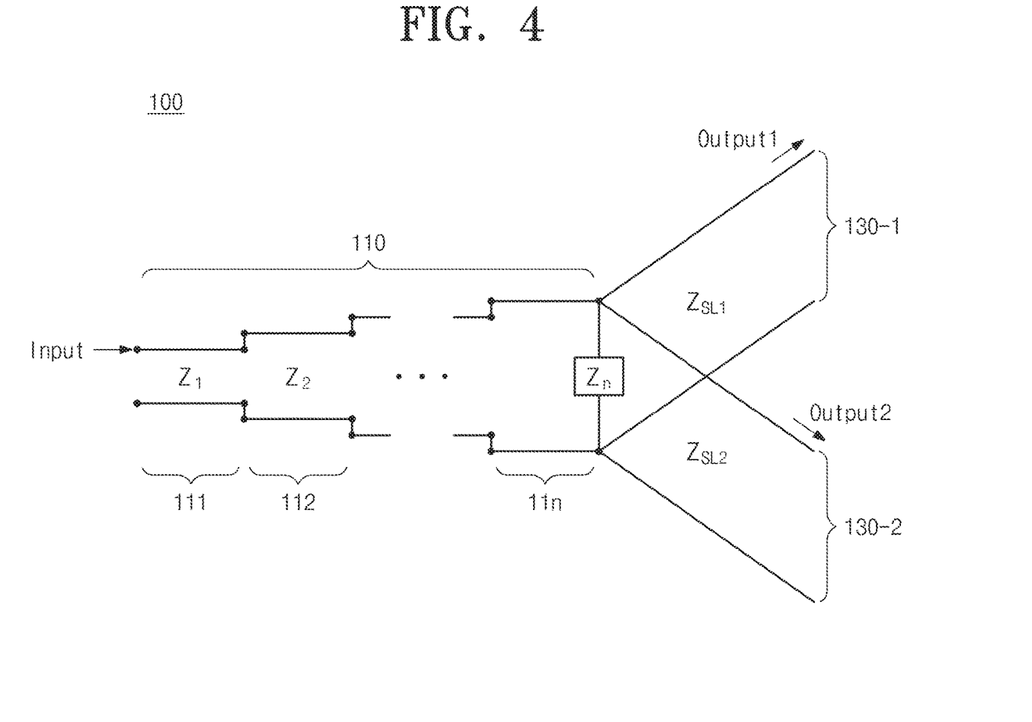
FIG. 4 is a circuit diagram illustrating an equivalent circuit of an impedance matching device illustrated in FIG. 3.

FIG. 4 is a circuit diagram illustrating an equivalent circuit of an impedance matching device 100 illustrated in FIG. 3. Even though FIG. 4 is a circuit diagram, the widths of a circuit corresponding to the first to n-th segments 111 to 11$n$ are illustrated as being different from one another. This may be to symbolically represent that the magnitude of the impedance $Z_1$ of the first segment 111 is the smallest and the magnitude of the impedance $Z_n$ of the n-th segment 11$n$ is the greatest.

Referring to FIG. 4, the characteristic impedance of the first segment 111 may be $Z_1$, and the characteristic impedance of the second segment 112 may be $Z_2$. Similarly, the characteristic impedance of the n-th segment 11$n$ may be $Z_n$. The 'n' may be an integer greater than 2, and as 'n' increases, the magnitude of $Z_n$ may decrease. Moreover, a combined impedance of the characteristic impedance $Z_{SL1}$ of the first strip line and the characteristic impedance $Z_{SL2}$ of the second strip line should be matched with the characteristic impedance $Z_n$ of the n-th segment 11n. In this case, a condition for reducing or minimizing a reflection loss may be expressed according to Equation 1.

$$\frac{1}{Z_n} = \frac{1}{Z_{SL1}} + \frac{1}{Z_{SL2}} \qquad \text{[Equation 1]}$$

According to an example embodiment of the inventive concepts, an impedance matching device reducing or minimizing a reflection loss may be provided by adjusting the widths W1 to Wn of the segments 111 to 11n so as to satisfy the condition of Equation 1. Continually, the second condition for implementing the impedance matching device 100 matching characteristic impedance will be described with reference to FIG. 5.

Figure 5:
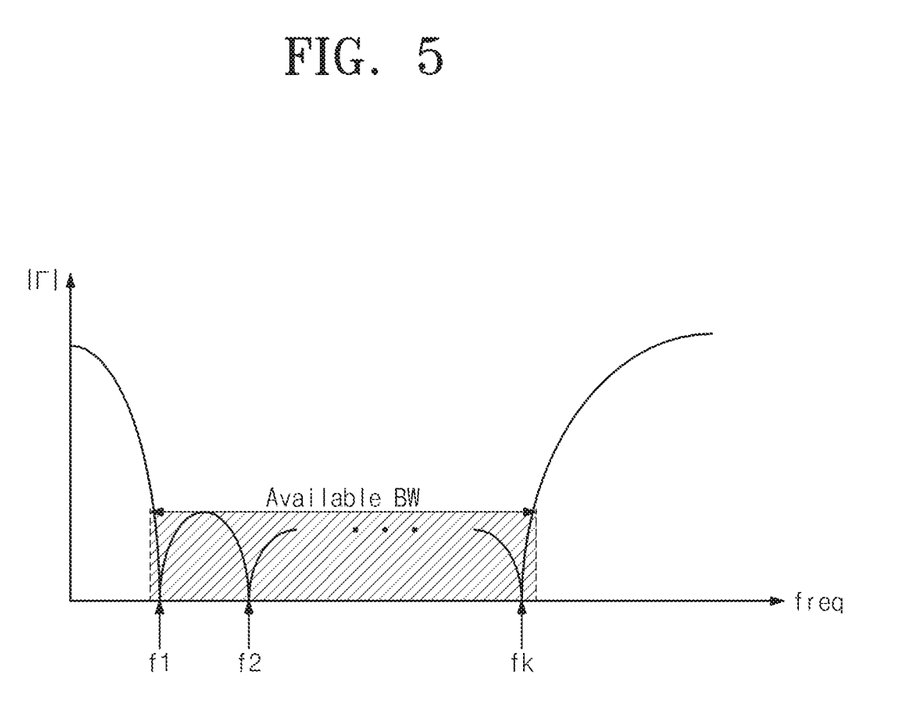
FIG. 5 is a graph illustrating a magnitude of a reflection coefficient of an impedance matching device according to frequency variation.

FIG. 5 is a graph illustrating a magnitude of a reflection coefficient of an impedance matching device 100 according to frequency variation. Moreover, it is assumed that the input signal Input (refer to FIG. 3) input to the impedance matching device 100 according to an example embodiment of the inventive concepts is a signal transmitted according to a base band transmission method.

Referring to FIG. 5, it is understood that each of frequencies f1 to fn is a frequency of which a reflection coefficient Γ is '0' (or is reduced or minimized). Moreover, it is understood that the magnitude of a reflection impedance where a frequency of the input signal Input input to the impedance matching device 100 is between about f1 and about fk is smaller than the magnitude of a reflection impedance where a frequency is smaller than about f1 or greater than about fk. This may mean that a frequency between about f1 and about fk is an available bandwidth BW of the impedance matching device 100. To secure the quality of the input signal Input transmitted in terms of signal integrity, this may be because the magnitude of a reflection coefficient Γ should be as small as possible.

Of course, it is not necessary that a frequency is precisely between f1 and fk. As illustrated in FIG. 5, an available minimum frequency may be slightly smaller than f1, and an available maximum frequency may be slightly greater than fk. In this case, a margin may be determined according to various factors such as the specification of test equipment or a test system, to which the impedance matching device 100 according to an example embodiment of the inventive concepts is applied, and the number of the segments 111 to 11n constituting the taped strip line 110.

f1 being a frequency of which a reflection coefficient Γ is '0' for the first time may correspond to a fundamental frequency corresponding to half of the frequency of the input signal Input input to the impedance matching device 100. For example, when the input signal Input is transmitted at a speed of 3.2 Gbps according to a base band transmission method, there are required signals having frequencies such as 1.6 GHz, 3.2 GHz, 4.8 GHz, . . . , and 1.6×n GHz. That is, f1 being a frequency of which a reflection coefficient Γ is '0' for the first time may correspond to a signal having a frequency of 1.6 GHz being a fundamental frequency. f2 being a frequency of which the next reflection coefficient Γ is '0' for the second time may correspond to a signal having a frequency of 3.2 GHz. Similarly, fn may correspond to a signal having a frequency of 1.6×n GHz.

According to an example embodiment of the inventive concepts, the available bandwidth BW may be extended by increasing the number of the segments 111 to 11n constituting the tapered strip line 110. Unlike an impedance matching device such as a conventional quarter-wave impedance transformer the impedance matching device 100 according to an example embodiment of the inventive concepts may not have a limitation of a length of each of the segments 111 to 11n constituting the tapered strip line 110. According to the conventional quarter-wave impedance transformer, a length of each of the segments 111 to 11n is a quarter of the wavelength of an input signal. On the other hand, in the case of the impedance matching device 100 according to an example embodiment of the inventive concepts, the length of the tapered strip line 110 need not be fixed. However, the available bandwidth BW may be adjusted by adjusting the number of the segments 111 to 11n constituting tapered strip line 110. In an example embodiment, the length (i.e., L1+L2+ . . . +Ln) of the tapered strip line 110 may be half of the wavelength of the input signal Input (refer FIG. 4).

As described above, an available impedance matching device may be provided to a digital signal based on the base band transmission method by adjusting the width Wn of the second end 124 (refer to FIG. 3) of the tapered strip line 110 such that an impedance matching occurs between the tapered strip line 110 and the strip lines 130-1 and 130-2 and adjusting the number of the segments 111 to 11n constituting the tapered strip line 110.

Except that an impedance matching occurs at a split point i.e., a point where the tapered strip line is in contact with the strip lines) of the impedance matching device 100, there may not be a limitation about the strip lines 130-1 and 130-2 (refer to FIG. 3). However, the length of each of the strip lines should be identical with each other. This example embodiment is illustrated in FIG. 6.

Figure 6:
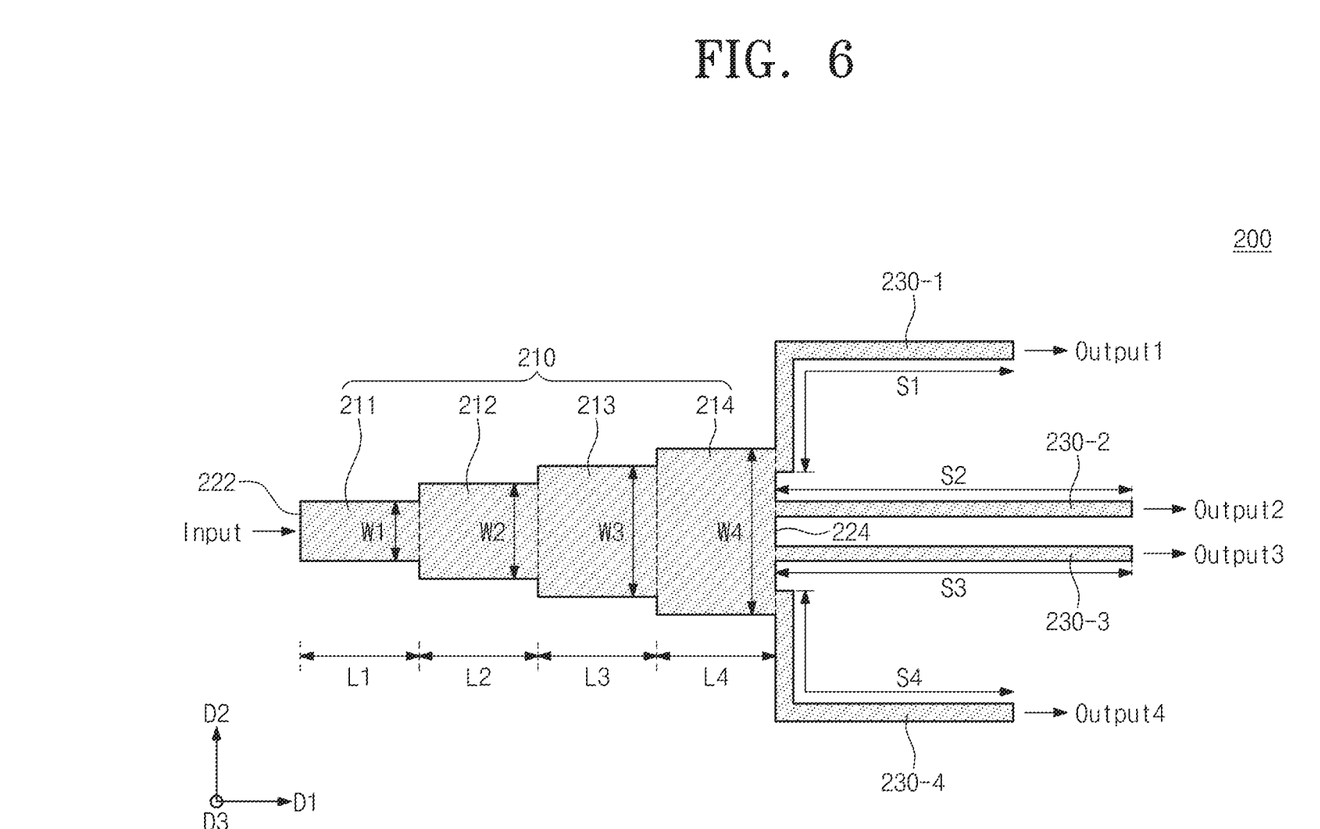
FIG. 6 is a plan view illustrating an impedance matching device according to an example embodiment of the inventive concepts.

FIG. 6 is a plan view illustrating an impedance matching device 200 according to an example embodiment of the inventive concepts. An impedance matching device 200 may include a tapered strip line 210 and a plurality of strip lines 230-1 to 230-4.

The tapered strip line 210 may be composed of a plurality of segments each of which has a width different from one another. In an example embodiment, the tapered strip line 210 is illustrated as being composed of four segments 211 to 214. The first segment 211 may have a length of L1 in the first direction D1 and a width of W1 in the second direction D2. The second segment 212 may have a length of L2 in the first direction D1 and a width of W2 in the second direction D2. The third segment 213 may have a length of L3 in the first direction D1 and a width of W3 in the second direction D2. Moreover, the fourth segment 214 may have a length of L4 in the first direction D1 and a width of W4 in the second direction D2.

The strip lines 230-1 to 230-4 may be connected to a second end 224 of the tapered strip line 220. The length of each of the strip lines 230-1 to 230-4 may be identical with one another. That is, S1 to S4 may be identical with one another. Even though S1 and S2 are shown as illustrated in FIG. 6 due to the difficulty in illustration, it is understood that each of S1 and S2 is referred to as a length crossing a center of the width of each of the strip line 230-1 and the strip line 230-2.

Output signals Output1 to Output4 may be output through ends of the plurality of strip lines 230-1 to 230-4 which are not connected to the tapered strip line 210. A test target (i.e., device under test) may be connected to the ends. Accordingly, to reduce or prevent a skew, times from a point in time when the input signal Input is input from an external device (e.g., test equipment, ATE) to a first stage 222 of the tapered strip line 210 to points in time when the input signal is respectively transmitted to test targets (i.e., devices under test) may be identical with one another.

As in an example embodiment described in FIG. 6, the output signals Output1 to Output4 output through ends of the strip lines 230-1 to 230-4 may be input to different test targets (i.e., devices under test) from one another. However, the output signals Output1 to Output4 may be input to one test target device under test). That is, the output signals Output1 to Output4 may be input to different pads of one test target (i.e., device under test), respectively. This example embodiment is illustrated in FIG. 7.

Figure 7:
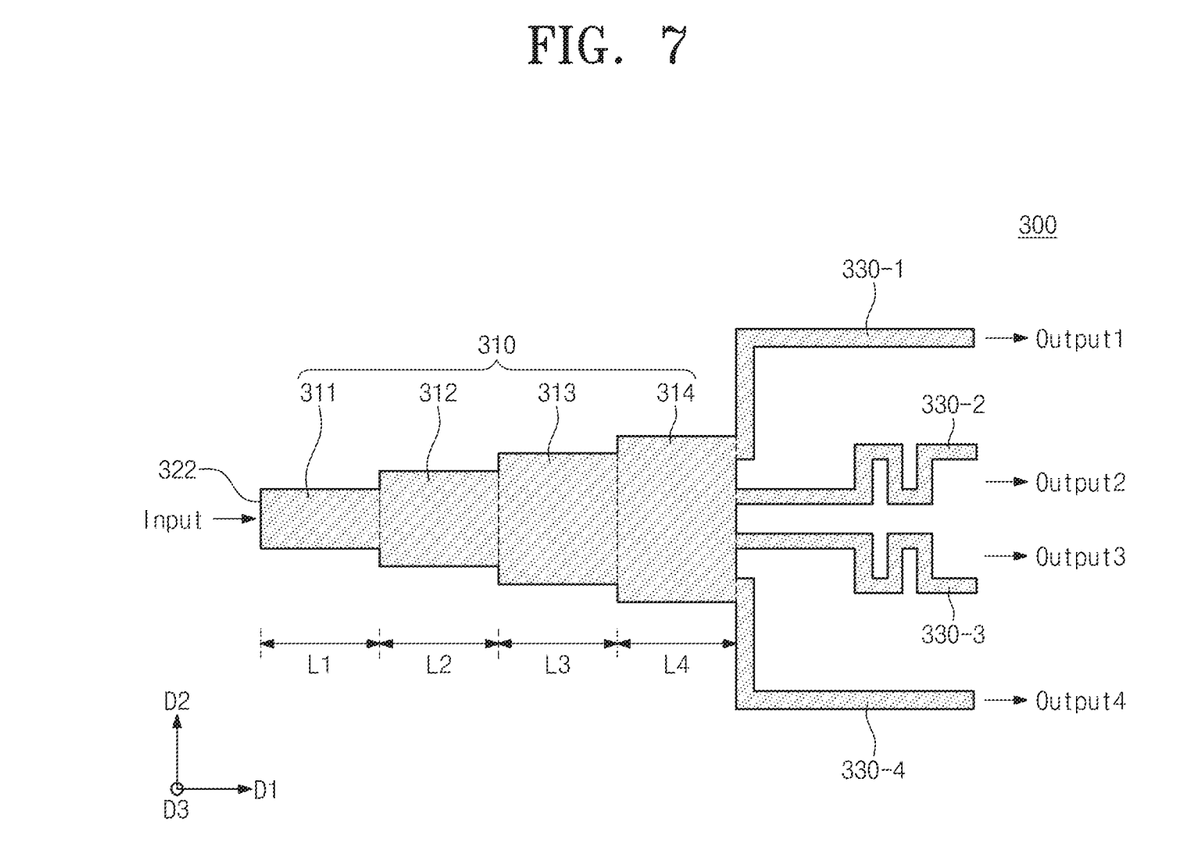
FIG. 7 is a plan view illustrating an impedance matching device according to an example embodiment of the inventive concepts.

FIG. 7 is a plan view illustrating an impedance matching device 300 according to an example embodiment of the inventive concepts. An impedance matching device 300 may include a tapered strip line 310 and a plurality of strip lines 330-1 to 330-4. The tapered strip line 310 may be similar to the tapered strip line 210 described in FIG. 7. However, in terms of a form, the strip lines 330-1 to 330-4 may be slightly different from the strip lines described in FIG. 6.

For example, when the output signals Output1 to Output4 are respectively input to a plurality of pads arranged at one edge of one test target (or device under test), the second and third strip lines 330-2 and 330-3 may take a zigzag form as illustrated in FIG. 7 such that lengths of the plurality of strip lines 330-1 to 330-4 are identical with one another. Moreover, lengths of the first to fourth strip lines 330-1 to 330-4 may be identical with one another.

Figure 8:
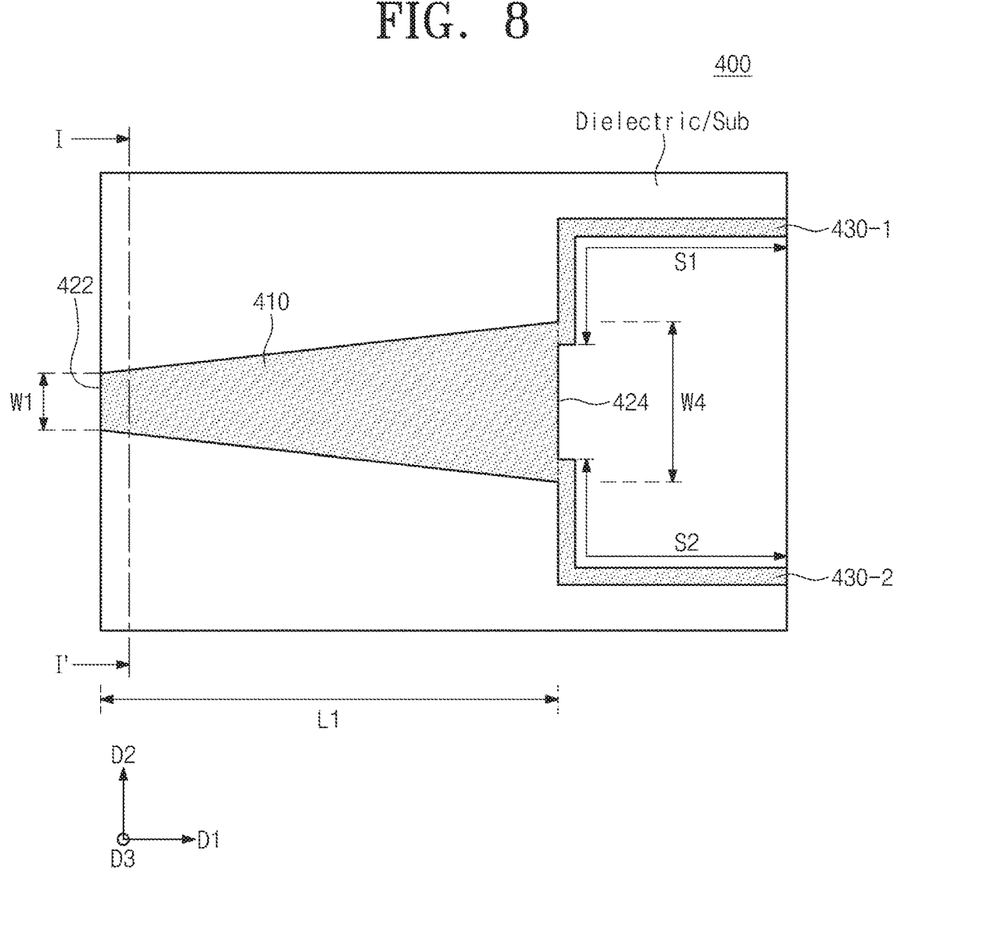
FIG. 8 is a plan view illustrating an impedance matching device according to an example embodiment of the inventive concepts.
Figure 9:
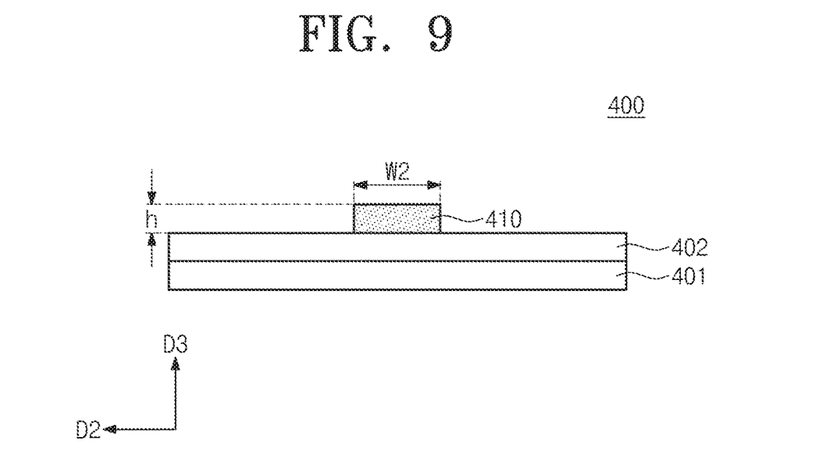
FIG. 9 is a cross-sectional view taken along I-I' line of FIG. 8.

FIG. 8 is a plan view illustrating an impedance matching device 400 according to an example embodiment of the inventive concepts. Referring to FIG. 8, an impedance matching device 400 may include a tapered strip line 410 and a plurality of strip lines 430-1 and 430-2. In FIG. 9, the impedance matching device 400 is illustrated as being arranged on a substrate and a dielectric layer.

The tapered strip line 410 may be arranged to extend in the first direction D1 and may have a width in the second direction D2 perpendicular to the first direction D1. The tapered strip line 410 may have a first end 422 through which a digital signal is input and a second end 424 which is a point where the second end 424 is contact with the strip lines 430-1 and 430-2. Moreover, the signal input through the first end 422 may be split at the second end 424 and may be output to ends of the strip lines 430-1 and 430-2.

A length of the tapered strip line 410 may be L1. A width of the first end 422 may be W1, and a width of the second end 424 may be W4. Moreover, as extending in the first direction D1, the width of the tapered strip line 410 may increase. That is, the width W4 of the second end 424 may be greater than the width W1 of the first end 422.

The plurality of strip lines 430-1 and 430-2 may be connected to the second end 424 of the tapered strip line 410. As illustrated in FIG. 8, each of the strip lines 430-1 and 430-2 may be connected to a portion of the second end 424 of the tapered strip line 410. Moreover, a length S1 of the first strip line 430-1 and a length S2 of the second strip line 430-2 may be identical with each other.

FIG. 9 is a cross-sectional view taken along line of FIG. 8. A width W2 of the tapered strip line 410 may be illustrated according to a cross-sectional view. The width W2 may be greater than the width W1 of the first end 422 and smaller than the width W4 of the second end 424.

The dielectric layer 402 may be provided on the substrate 401. For example, the substrate 401 may include at least one of various types of substrates such as a printed circuit board (PCB), a flexible board, and a tape board. The impedance matching device 400 may be provided on the dielectric layer 402. However, because FIG. 9 is a cross-sectional view, FIG. 9 only illustrates the tapered strip line 410.

The tapered strip line 410 may include various conductive materials such as a metal. Likewise, although not illustrated, the strip lines 430-1 and 430-2 (refer to FIG. 8) may include various conductive materials. The tapered strip line 410 may have a thickness of 'h' in the third direction D3 perpendicular to the second direction D2.

Figure 10:
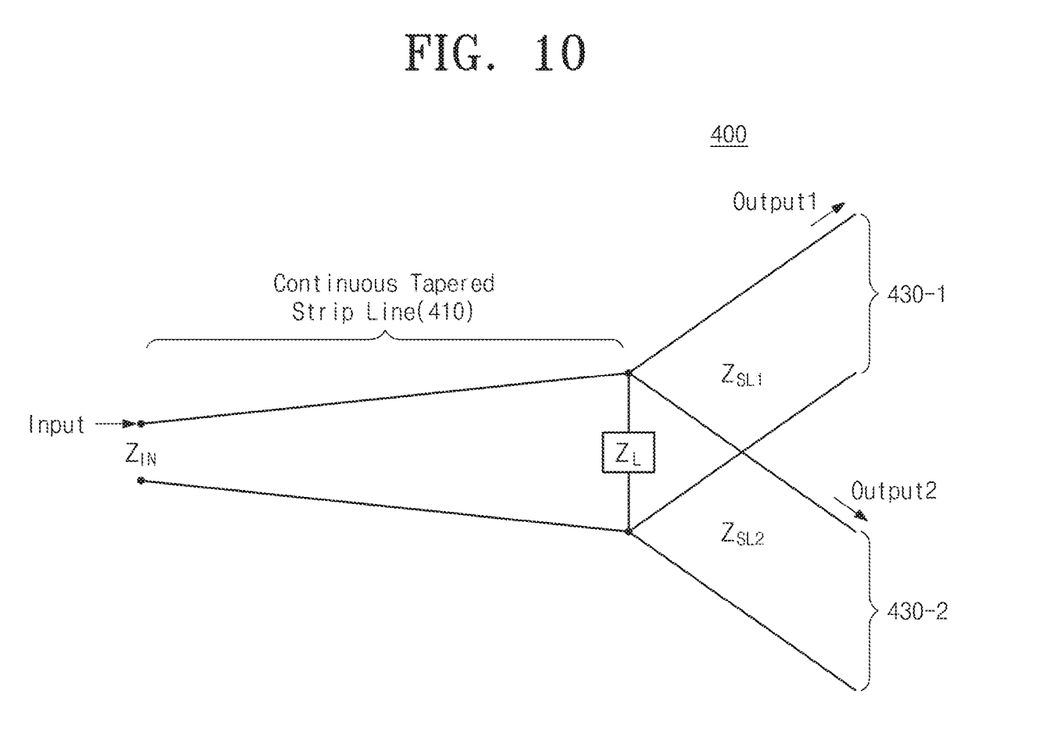
FIG. 10 is a circuit diagram illustrating an equivalent circuit of an impedance matching device illustrated in FIG. 8.

FIG. 10 is a circuit diagram illustrating an equivalent circuit of an impedance matching device 400 illustrated in FIG. 8. Even though FIG. 10 is a circuit diagram, the width between terminals to which impedance ZL is connected is illustrated as being different from the width between terminals to which the input signal Input is input. This may be to symbolically represent that the magnitude of the impedance ZIN of the first end 422 (refer to FIG. 8) is the smallest and the magnitude of the impedance ZL of the second end 424 (refer to FIG. 8) is the greatest.

As illustrated in FIG. 8, because the width of the tapered strip line 410 continuously increases extending in the first direction D1, the magnitude of the characteristic impedance of the tapered strip line 410 may continuously decrease. Moreover, impedance is matched to reduce or minimize a reflection loss at the second end 424 which is a portion where the tapered strip line 410 is in contact with the strip lines 430-1 and 430-2. In this case, a condition for reducing or minimizing a reflection loss may be expressed according to Equation 2.

$$\frac{1}{Z_L} = \frac{1}{Z_{SL1}} + \frac{1}{Z_{SL2}} \qquad \text{[Equation 2]}$$

According to an example embodiment of the inventive concepts, an impedance matching device reducing or minimizing a reflection loss may be provided by adjusting the width W4 of the tapered strip line 410 so as to satisfy the condition of Equation 2.

Figure 11:
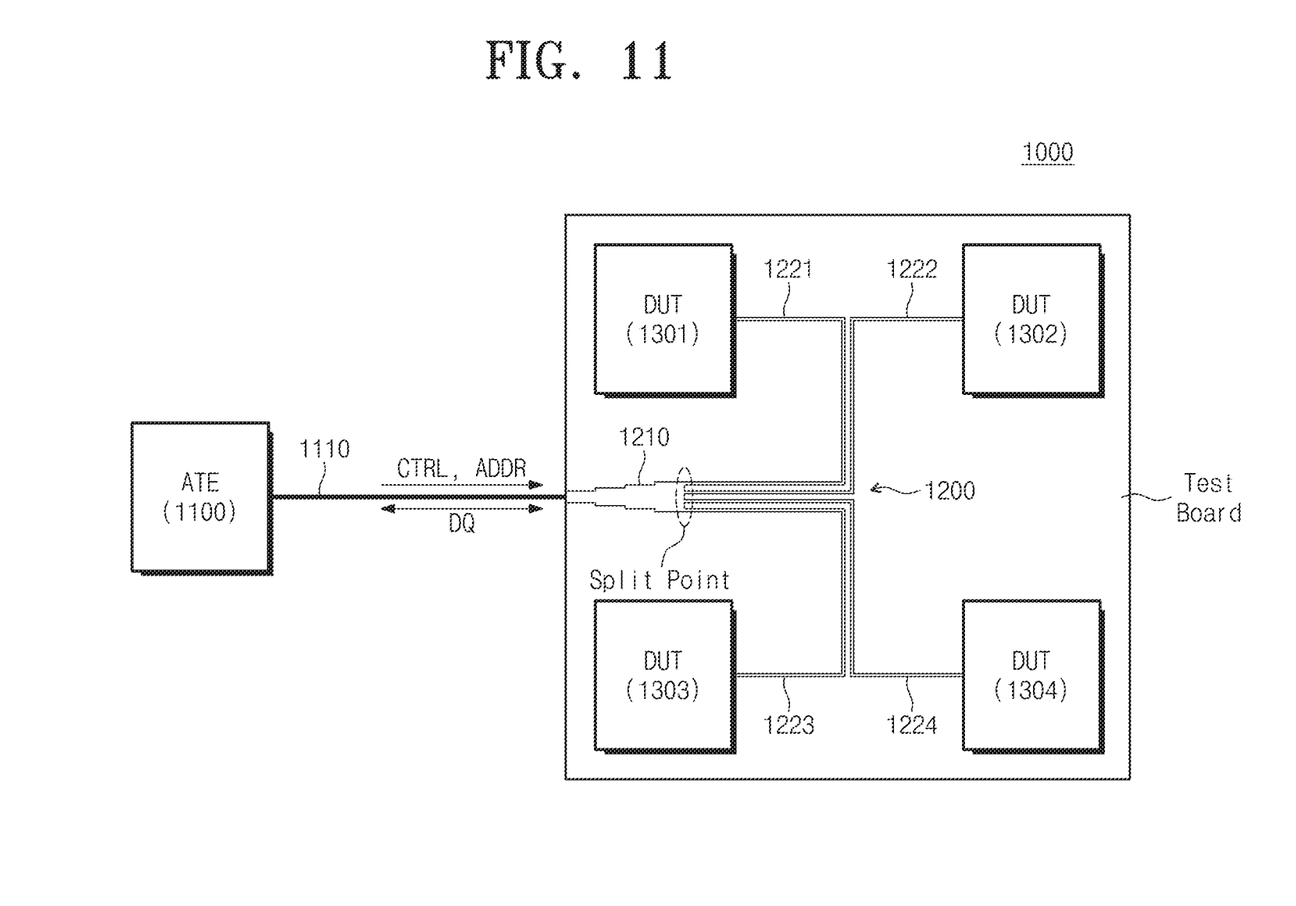
FIG. 11 is a block diagram illustrating a test system for a semiconductor device according to an example embodiment of the inventive concepts.

FIG. 11 is a block diagram illustrating a test system 1000 for a semiconductor device according to an example embodiment of the inventive concepts.

Referring to FIG. 11, a test system 1000 may include automatic test equipment (ATE) 1100, an impedance matching device 1200, and a plurality of devices under test (DUTs) (e.g., semiconductor devices) 1301 to 1304 provided on a test hoard. The impedance matching device 1200 may include a tapered strip line 1210 and a plurality of strip lines 1221 to 1224.

The ATE 1100 may perform various test operations with respect to the DUTs 1301 to 1304. For example, the ATE 1100 may transmit, through a transmission line 1110, a control signal CTRL, an address ADDR, and a test data DQ for performing a write operation or a read operation with respect to the DUT 1301. The control signal CTRL may include various commands for performing a write operation or a read operation. The address ADDR may include a logical address of the DUTs 1301 to 1304 in which the test data DQ will be stored according to the write operation. Moreover, the address ADDR may include a logical address of the DUTs 1301 to 1304 in which the test data DQ to be read is stored according to the read operation.

The control signal CTRL, the address ADDR, and the test data DQ which are input to the tapered strip line 1210 may be split at a split point and may be transmitted to the DUTs 1301 to 1304 through the strip lines 1221 to 1224. The tapered strip line 1210 may have the same structure as the structure described in FIGS. 1 to 7. That is, the tapered strip line 1210 may be composed of a plurality of segments each of which has a width different from one another. Moreover, the width of the tapered strip line 1210 may be adjusted such that an impedance matching occurs at a split point.

Even though the tapered strip line 1210 is illustrated as being the discrete tapered strip line described in FIGS. 1 to 7, the tapered strip line 1210 may be a continuous tapered strip line as described in FIGS. 8 to 10. Moreover, to reduce or prevent a skew, the strip lines 1221 to 1224 may each have the same length.

The test system 1000 according to an example embodiment of the inventive concepts may provide an impedance matching device for reducing or preventing the control signal CTRL, the address ADDR, and the test data DQ, which are input through the transmission line 1110, from being lost by a reflection loss at a split point. As a result, the efficiency of a test operation about the DUTs 1301 to 1304 may be improved.

Figure 12:
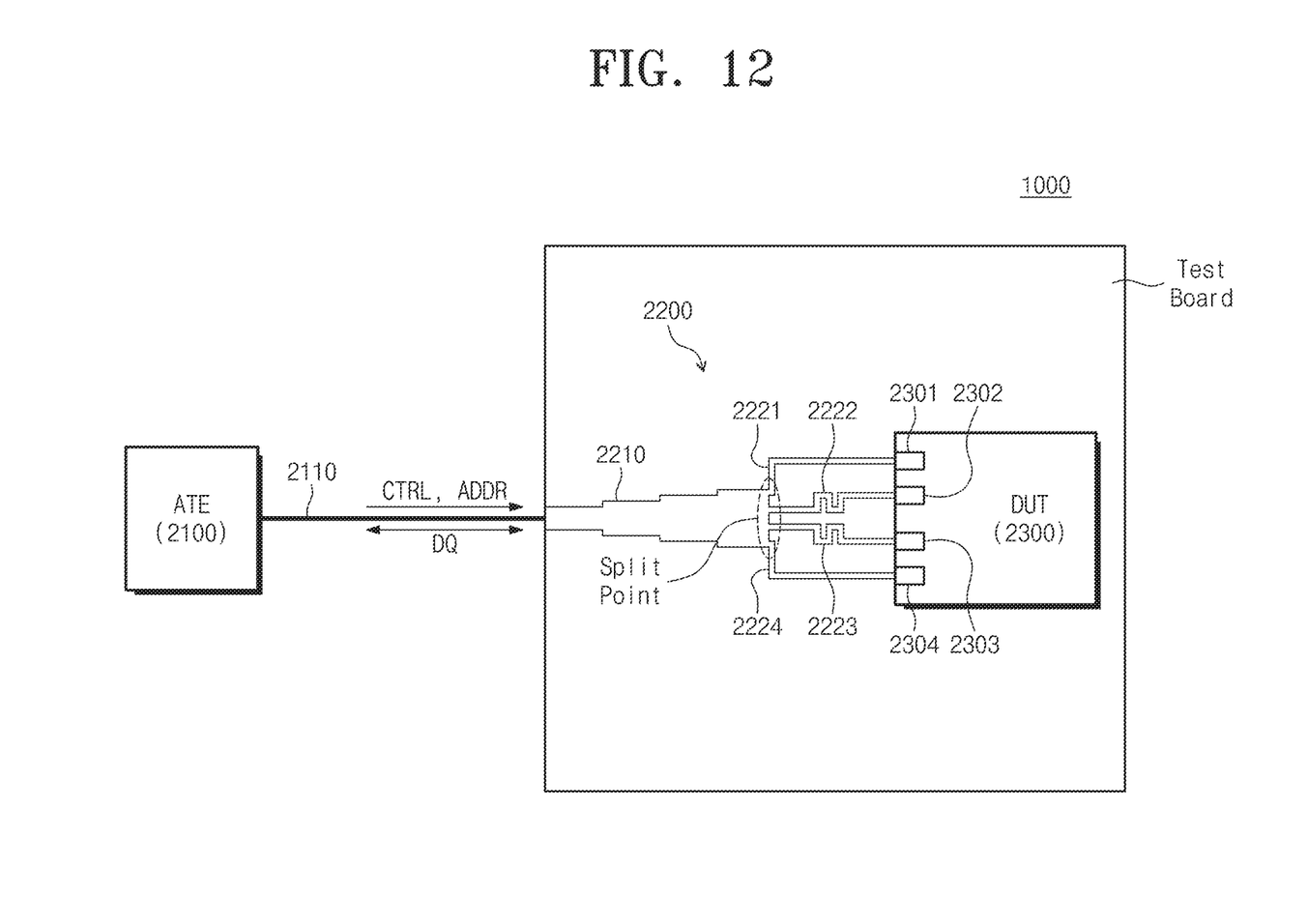
FIG. 12 is a block diagram illustrating a test system for a semiconductor device according to an example embodiment of the inventive concepts.

FIG. 12 is a block diagram illustrating a test system 2000 for a semiconductor device according to an example embodiment of the inventive concepts. Unlike an example embodiment described in FIG. 11, according to an example embodiment of the inventive concepts, a signal split through an impedance matching device is illustrated as being input to different pads 2301 to 2304 of one DUT 2300.

A test system 2000 according to an example embodiment of the inventive concepts may include an ATE 2110, an impedance matching device 2200, and a DUT 2300. The impedance matching device 2200 may include a tapered strip line 2210 and a plurality of strip lines 2221 to 2224.

As illustrated in FIG. 12, the tapered strip line 2210 may be a discrete tapered strip line and may be a continuous tapered strip line described in FIGS. 8 to 10. The strip lines 2221 to 2224 may be connected to a plurality of pads 2301 to 2304, respectively. To reduce or prevent a skew, the strip lines 2221 to 2224 may each have the same length.

In FIG. 12, the strip lines 2221 to 2224 are illustrated as being only connected to one edge of the DUT 2300. However, the strip lines 2221 to 2224 may be connected to pads provided at four edges of the DUT 2300. In this case, the strip lines should be arranged such that all the lengths of the strip lines are the same.

The test system 2000 according to an example embodiment of the inventive concepts may provide an impedance matching device for reducing or preventing the control signal CTRL, the address ADDR, and the test data DQ, which are input through the transmission line 2110, from being lost by a reflection loss at a split point. As a result, the efficiency of a test operation about the DUT 2300 may be improved.

Figure 13:
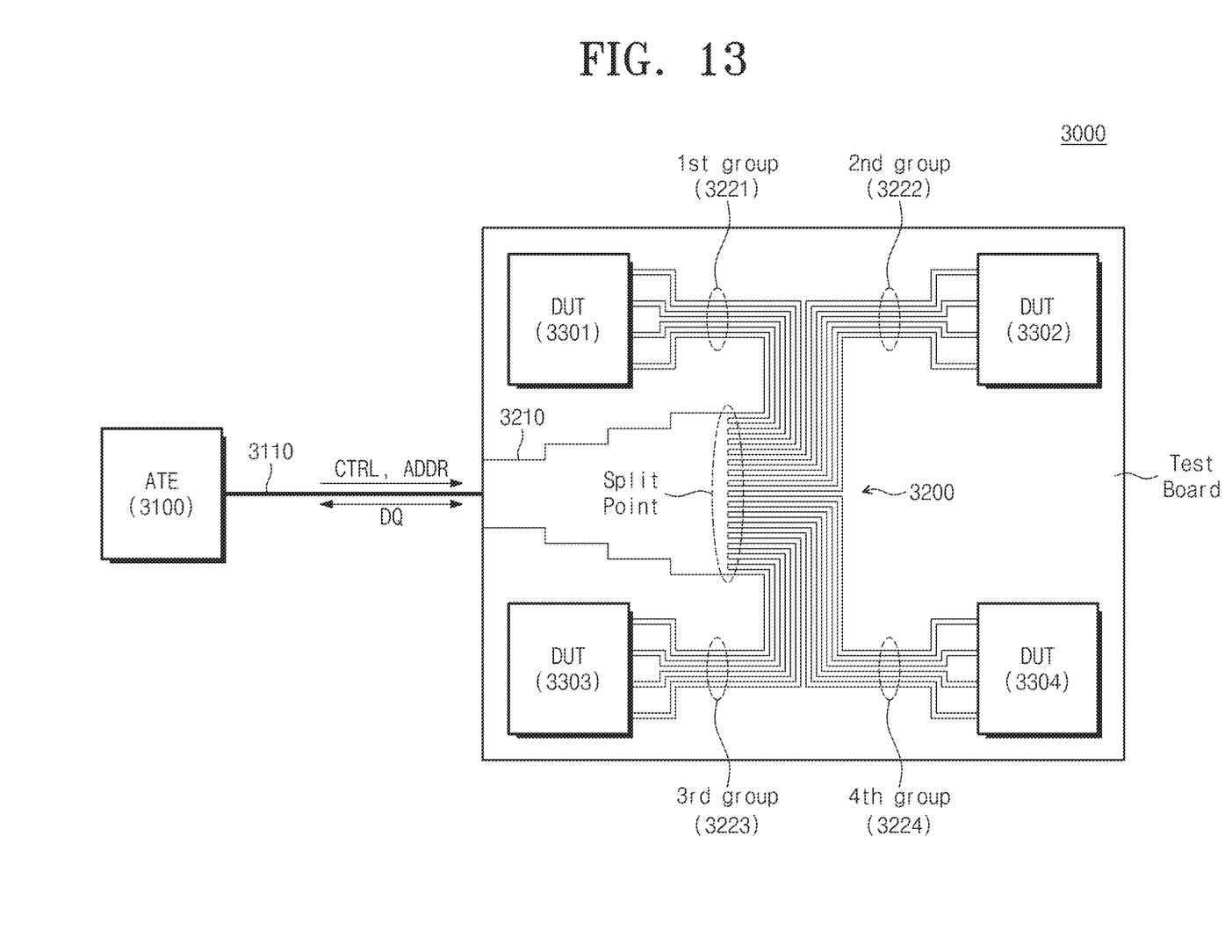
FIG. 13 is a block diagram illustrating a test system for a semiconductor device according to an example embodiment of the inventive concepts.

FIG. 13 is a block diagram illustrating a test system 3000 for a semiconductor device according to an example embodiment of the inventive concepts. Unlike an embodiment described in FIG. 11, according to an example embodiment of the inventive concepts, a signal split through an impedance matching device 3200 is illustrated as being input to a plurality of pads 2301 to 2304 of each of the DUTs 3301 to 3302. To simplify the drawings, it is assumed that an impedance matching device 3200 is split into sixteen strip lines and pads are only provided at one edge of each of the DUTs 3301 to 3302.

The strip line 3221 of a first group split from the impedance matching device 3200 may be connected to pads provided at one edge of the first DUT 3301. The strip line 3222 of a second group split from the impedance matching device 3200 may be connected to pads provided at one edge of the second DUT 3302. The strip line 3223 of a third group split from the impedance matching device 3200 may be connected to pads provided at one edge of the third DUT 3303. Moreover, the strip line 3224 of a fourth group split from the impedance matching device 3200 may be connected to pads provided at one edge of the fourth DUT 3304. That is, the tapered strip line 3210 and the strip lines 3221 to 3224 which constitute the impedance matching device 3200 may be connected around a split point.

The tapered strip line 3210 is illustrated as being the discrete tapered strip line described in FIGS. 1 to 7. However, the tapered strip line 3210 may be a continuous tapered strip line described in FIGS. 8 to 10. Moreover, to reduce or prevent a skew, the strip lines 3221 to 3224 may have the same length with one another. Even though FIG. 13 is illustrated to simplify the drawings, at least a portion of the strip lines 3221 to 3224 may have a zigzag form such as the second strip line 330-2 or the third strip line 330-3 illustrated in FIG. 7 such that the strip lines 3221 to 3224 each have the same length.

Above, a test operation may be performed with respect to a DUT (e.g., semiconductor device) using an impedance matching device having a structure described herein, thereby reducing or minimizing the distortion of a signal due to a reflection loss occurring at a split point of the impedance matching device. As a result, the reliability of a test operation may be improved.

According to an example embodiment of the inventive concepts, an impedance matching device may reduce or minimize a reflection loss according to the split of a signal during the test operation of a semiconductor device.

Those of ordinary skill in the art will recognize that various changes and modifications of the embodiments described herein can be made without departing from the scope and spirit of the inventive concepts. If modifications of the present inventive concepts are included within the scope of the following claims and equivalents, example embodiments are considered to include the modifications and variations of the inventive concepts.

What is claimed is:

1. An impedance matching device, comprising:
a tapered strip line extending in a first direction on a substrate and having a width in a second direction perpendicular to the first direction, the tapered strip line including first to n-th segments having identical lengths and different widths, wherein the 'n' is a natural number of two or more; and
a plurality of strip lines connected to the n-th segment such that an input signal received through the first segment is split,
wherein a length of the tapered strip line is half of a wavelength of the input signal.

2. The impedance matching device of claim 1, wherein a combined impedance of the strip lines and an impedance of the n-th segment are identical to each other.

3. The impedance matching device of claim 1, wherein the input signal is a digital signal transmitted according to a base band transmission method.

4. The impedance matching device of claim 1, wherein the width of the first to n-th segments increases in accordance with an increase in the 'n'.

5. The impedance matching device of claim 1, wherein lengths of the strip lines are identical to one another.

6. The impedance matching device of claim 1, further comprising:

a dielectric layer between the substrate and the tapered strip line, and between the substrate and the strip lines.

7. A test system, comprising:

automatic test equipment (ATE) configured to perform a test operation with respect to a plurality of devices under test; and an impedance matching device configured to receive an input signal for performing the test operation, to split the input signal, and to transmit the split input signal to the plurality of devices under test, the impedance matching device including,
- a tapered strip line extending in a first direction on a substrate and having a width in a second direction perpendicular to the first direction, the tapered strip line including first to n-th segments having identical lengths and different widths, wherein the 'n' is a natural number of two or more, and
- a plurality of strip lines connected to the n-th segment such that the input signal is split, wherein a length of the tapered strip line is half of a wavelength of the input signal.

8. The test system of claim 7, wherein a combined impedance of the strip lines and an impedance of the n-th segment are identical to each other.

9. The test system of claim 7, wherein the input signal is a digital signal transmitted according to a base band transmission method.

10. The test system of claim 7, wherein the width of the first to n-th segments increases in accordance with an increase in the 'n'.

11. The test system of claim 7, wherein lengths of the strip lines are identical to one another.

* * * * *